US012813288B2

(12) United States Patent
Agarwal et al.

(10) Patent No.: US 12,813,288 B2
(45) Date of Patent: Nov. 24, 2026

(54) SEMICONDUCTOR INTERCONNECT BRIDGE PACKAGING

(71) Applicant: Microsoft Technology Licensing, LLC, Redmond, WA (US)

(72) Inventors: Rahul Agarwal, Livermore, CA (US); Jon Thomas Woodyard, Livermore, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 751 days.

(21) Appl. No.: 17/900,153

(22) Filed: Aug. 31, 2022

(65) Prior Publication Data

US 2024/0071778 A1 Feb. 29, 2024

(51) Int. Cl.

| | |
|---|---|
| ***H01L 21/48*** | (2006.01) |
| ***H01L 23/538*** | (2006.01) |
| ***H10W 70/05*** | (2026.01) |
| ***H10W 70/60*** | (2026.01) |
| ***H10W 70/65*** | (2026.01) |
| ***H10W 70/66*** | (2026.01) |
| ***H10W 70/692*** | (2026.01) |
| ***H10W 70/695*** | (2026.01) |
| ***H10W 74/01*** | (2026.01) |
| ***H10W 90/00*** | (2026.01) |

(52) U.S. Cl.

CPC ....... *H10W 70/095* (2026.01); *H10W 70/093* (2026.01); *H10W 70/611* (2026.01); *H10W 70/65* (2026.01); *H10W 70/66* (2026.01); *H10W 70/692* (2026.01); *H10W 70/695* (2026.01); *H10W 74/016* (2026.01); *H10W 90/00* (2026.01); *H10W 90/401* (2026.01); *H10W 90/701* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 2018/0102311 | A1* | 4/2018 | Shih | H01L 25/0655 |
| 2019/0096851 | A1* | 3/2019 | Liao | H01L 25/065 |
| 2020/0243449 | A1* | 7/2020 | Chiang | H01L 23/5386 |
| 2021/0020574 | A1 | 1/2021 | Yu | |
| 2021/0134724 | A1 | 5/2021 | Rubin | |
| 2021/0134728 | A1* | 5/2021 | Rubin | H01L 21/4853 |
| 2021/0272929 | A1* | 9/2021 | Tsai | H01L 23/5383 |
| 2021/0407962 | A1 | 12/2021 | Kim | |
| 2022/0045008 | A1* | 2/2022 | Kang | H01L 21/4857 |

OTHER PUBLICATIONS

International Search Report and Written Opinion received for PCT Application No. PCT/US2023/027696 filed Jul. 14, 2023, Nov. 6, 2023, 15 pages.

* cited by examiner

*Primary Examiner* — Lawrence C Tynes, Jr.

(74) *Attorney, Agent, or Firm* — Seed Intellectual Property Law Group LLP

(57) ABSTRACT

Embodiments of the present disclosure include techniques for a package and process for semiconductor dies. An interconnect bridge includes first conductors that electrically connect two or more semiconductor die. The interconnect bridge includes second conductors between opposite surfaces. A substrate of the interconnect bridge is removed to expose conductors of an interconnect layer that are electrically coupled to connections to the first and second semiconductor dies in a region of overlap between the semiconductor dies and interface bridge.

19 Claims, 6 Drawing Sheets

SEMICONDUCTOR INTERCONNECT BRIDGE PACKAGING

BACKGROUND

The present disclosure relates generally to semiconductor packaging, and in particular, to power delivery in semiconductor packaging.

Semiconductor devices are typically manufactured in silicon. Thin slices of silicon (wafers) are processed to produce various electrical circuitry on an upper layer of the wafer. A single wafer typically has many of the same circuits formed in arrays on the wafer. The arrays of circuits may be cut to produce individual chips (integrated circuit chips, or IC chips). The chips are then packaged. A package houses one or more chips and provides electrical connections into the internal ICs in the package.

It is often advantageous to house many ICs in a single package. Some IC packages include internal circuitry to electrically connect the ICs internally. However, in some applications the internal connection circuit interferes with conductors between external package connections and internal package connections. This is especially important for power delivery. If power delivery conductors are forced to have extended wire runs due to internal connection circuitry, the longer wire runs can reduce the efficiency of the overall circuit and lead to other problems.

Embodiments described herein advantageously provide a semiconductor packaging techniques that reduce the impact of internal connection circuitry between multiple ICs in a package.

DETAILED DESCRIPTION

Described herein are techniques for storing and retrieving data in memories. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

Figure 1A:
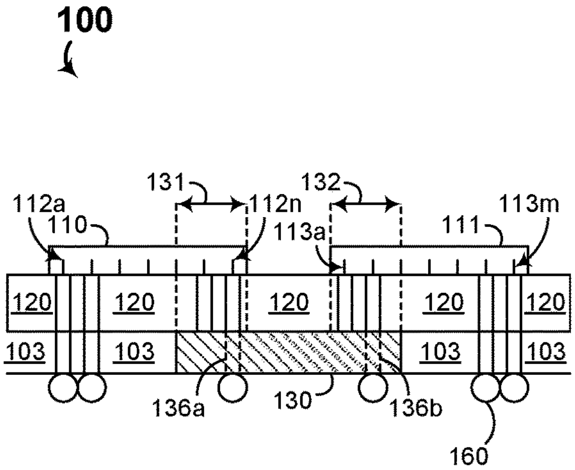
FIG. 1A illustrates a semiconductor package according to an embodiment.
Figure 1B:
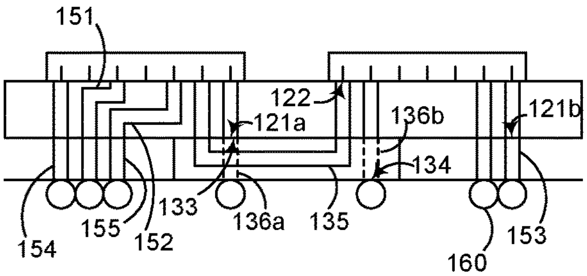
FIG. 1B illustrates the interconnect bridge of FIG. 1A according to an embodiment.

FIG. 1A illustrates a semiconductor package 100 according to an embodiment. FIG. 1B illustrates further aspects of the semiconductor package 100 according to an embodiment. Semiconductor package 100 includes a semiconductor dies 110 and 111 configured on a redistribution layer (RDL) 120 (as used herein, "die" is singular and refers to a single chip and "dies" is plural and refers to multiple chips). In this example, the semiconductor dies 110 and 111 reside on a surface formed by RDL 120. In this example, RDL 120 extends under both semiconductor dies 110 and 111, but in other embodiments individual RDLs may be formed under each semiconductor die, for example.

Features and advantages of the present disclosure include an interconnect bridge 130 configured between semiconductor dies to establish electrical connections between the semiconductor dies. Interconnect bridge 130 overlaps a portion of semiconductor dies 110 and 111, as illustrated at 131 and 132. Interconnect bridge 130 includes conductors configured to electrically couple semiconductor dies 110 and 111 through the redistribution layer 120, for example. Interconnect bridge 130 further includes conductors configured to electrically couple connections on a lower surface of the interconnect bridge (e.g., a surface opposite a surface adjacent to the RDL layer) to connections on an upper surface of the interconnect bridge (e.g., adjacent to the RDL layer) and connections of semiconductor dies 110 and 111 in a region where the interconnect bridge overlaps the semiconductor dies. Accordingly, signals and/or power may be delivered more directly to and/or from the semiconductor dies without having to be routed around the interconnect bridge, which advantageously reduces the length of such connections.

For example, semiconductor dies 110 and 111 include a plurality of connections 112*a-n* and 113*a-m*, respectively, for receiving and sending electrical signals or power. RDL 120 includes connections on the surface between RDL 120 and the semiconductor dies 110 and 111 (e.g., connection 122) coupled to the semiconductor die connections 112*a-n* and 113*a-m*. RDL 120 further includes connections on the surface between the RDL 120 and interconnect bridge 130 (e.g., connection 121) coupled to connections of the interconnect bridge 130. The RDL connections on the opposite surfaces are electrically coupled together. The locations of the connections on opposite surfaces, however, may be at different locations. For example, the location of the RDL connection coupled to a semiconductor connection may be in a different location on the RDL/interconnect bridge surface than the location of the connection on the RDL/semiconductor die surface. Redistribution of locations of connections allows for flexible matching of upper connection locations to locations of connections for structures on the opposite surface of the RDL, for example. In various embodiments, different RDL structures may be used for RDL 120. In some embodiments, fabricated RDLs comprising metalizations and silicon dioxide (herein, "oxide") may be used. For example, an RDL may comprise copper conductors separated by silicon dioxide. Such structures may be made using a dual Damascene process, for example. In other embodiments, manufactured RDLs, such as organic RDLs comprising polyimide may be used. In some example embodiments, organic RDLs may comprise copper and polyimide, for example.

In this example, interconnect bridge 130 comprises connections coupled to the lower connections of RDL 120 (e.g., connection 133) and connections on the opposite surface (e.g., connection 134) for connecting to a circuit board, for example. As mentioned above, interconnect bridge 130 includes two (2) different types of conductors (aka conductive traces). Conductors 135 (shown in FIG. 1B) are configured to electrically couple the connections 112*a-n* of semiconductor die 110 and connections 113*a-m* of semiconductor die 111 through RDL 120. Conductors 136 are configured to electrically couple one or more particular connections on the surface of the interconnect bridge opposite to RDL 120 (e.g., connection 134 on the lower bridge surface) to one or more connections of the interconnect bridge on opposite surface adjacent to RDL 120 (e.g., connection 133 on the upper bridge surface) and to one or more connections of semiconductor dies 110 and/or 111 in a region where the interconnect bridge overlaps the semiconductor dies.

As illustrated in FIGS. 1A and 1B, connections of the lower bridge surface may be coupled to solder bumps, such as solder bump 160, which may be used to establish connections to a printed circuit board, for example.

In this example, the lower surface of interconnect bridge extends under semiconductor dies 110 and 111 and comprises a molding compound 103 as is well known by those skilled in the art.

In the above example, two (2) semiconductor die are shown. However, in other embodiments additional numbers of semiconductor dies may be coupled together using an interconnect bridge using the techniques described herein.

In some example embodiments, conductors 135 between semiconductor dies are interface signal conductors and conductors 136*a-b* between the semiconductor dies and the lower surface of the interconnect bridge are power conductors. In some embodiments, the power conductors comprise thicker conductive traces or multiple conductive traces arranged in parallel to carry more current with less resistance. Additionally, in some embodiments, conductors 136*a-b* run substantially vertically from a solder bump (e.g., solder bump 160) on one or more lower connections of the interconnect bridge to one or more lower connections of the redistribution layer. Horizontal movement along the surface may be limited to within the overlapping region to advantageously reduce the length of the conductors and thereby reduce resistive voltage drops and thermal losses, for example.

In some embodiments, interconnect bridge 130 is substrateless. For example, a silicon bridge die may comprise a substrate (e.g., Pyrex glass or silicon) and metalization layer. The substrate is removed to produce a substrateless interconnect layer (e.g., copper conductors embedded in silicon dioxide or polyimide for routing between multiple die or between a die and a lower surface of the interconnect bridge).

In some embodiments, additional conductors may be configured vertically to electrically couple to the semiconductor dies in regions where the interconnect bridge 130 does not overlap the semiconductor dies. For example, conductors 153-155 are configured outside the region where the interconnect bridge 130 overlaps the semiconductor dies. Conductors 153-155 are configured extend vertically from the same plane as the lower connections (e.g., connection 134) of the interconnect bridge to RDL 120 (e.g., through a mold compound). RDL 120, in turn is electrically coupled to connections of the semiconductor dies. As illustrated in FIGS. 1A and 1B, these additional connections (e.g., connections 153-155) may be electrically coupled to a circuit board through solder bumps (e.g., solder bump 160).

Figure 2:
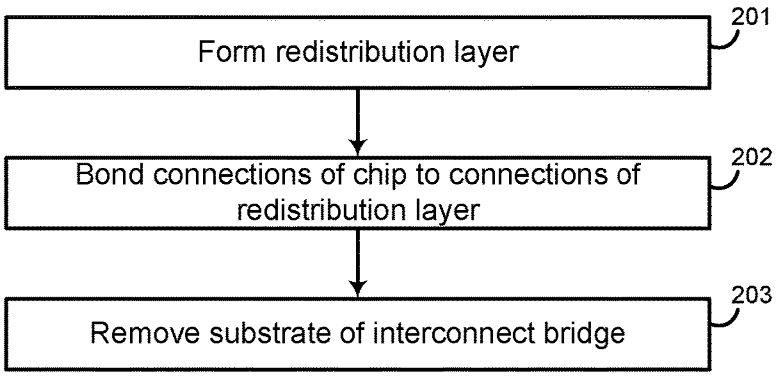
FIG. 2 illustrates a semiconductor packaging process according to an embodiment.

FIG. 2 illustrates a semiconductor packaging process according to an embodiment. At 201 a redistribution layer (RDL) is formed. In various embodiments, the RDL may be formed on a surface comprising either on the interconnect bridge or on the semiconductor dies as illustrated in more detail below. At 202, connections on the other structure (e.g., the interconnect bridge or semiconductor dies) not under the RDL are bonded to other surface of the RDL. Thus, if an RDL is formed on an interconnect bridge, then the semiconductor dies are bonded to the RDL on the opposite surface. Alternatively, if the RDL is formed on the semiconductor dies, then the interconnect bridge is bonded to the RDL on the opposite surface. At 203, the substrate of the interconnect bridge is removed to produce a substrateless interconnect bridge with exposed connections. For example, the expose connections run substantially vertically through the interconnect bridge, through the RDL, and to the connections on the semiconductor die (e.g., power connections). The exposed connections of the interconnect bridge may be electrically coupled to a circuit board using solder bumps, for example, as described in more detail below.

Figure 3:
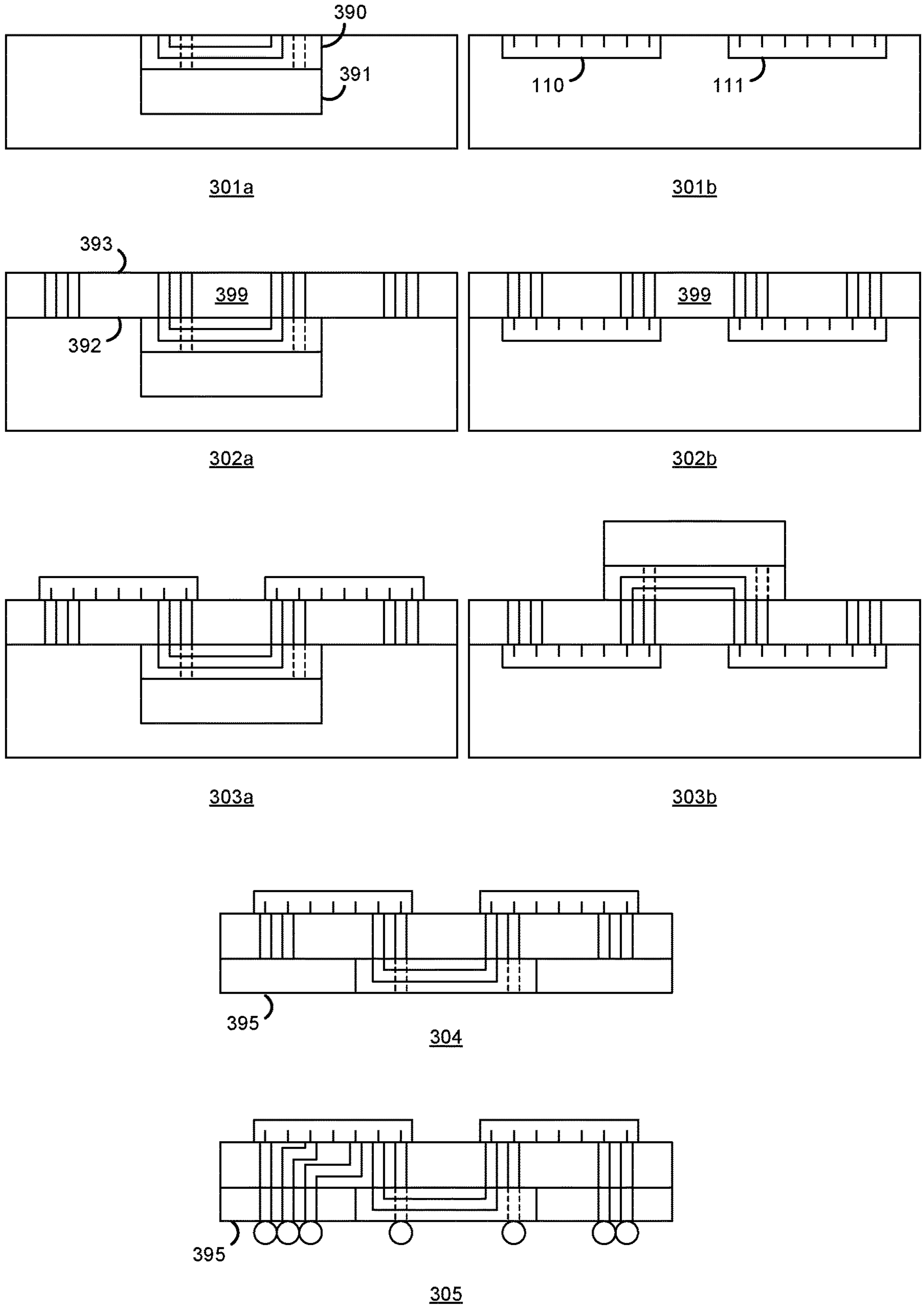
FIG. 3 illustrates a semiconductor packaging process according to an embodiment.

FIG. 3 illustrates a semiconductor packaging process according to an embodiment. 301*a-b* illustrate alternative starting conditions. At 301*a*, an interconnect bridge comprising an interconnect layer 390 and substrate 391 form a flat surface. Similarly, at 301*b*, semiconductor dies 110 and 111 form a flat surface. At 302*a-b*, an RDL 399 is formed on the surface. The RDL includes RDL surface 392 comprising a plurality of connections and RDL surface 393 comprising a plurality of connections. Particular connections on RDL surface 392 are electrically coupled to particular connections on RDL surface 393. In some cases, one RDL connection on RDL surface 392 is connected to one RDL connection on RDL surface 393. However, in other cases multiple RDLs are coupled together (e.g., for higher current carrying capability). As illustrated in FIG. 3, connections in the RDL layer surface 392 are electrically coupled to connections on either an interconnect bridge (302*a*) or the semiconductor dies (302*b*).

At 303*a-b*, the other of the interconnect bridge or semiconductor dies are bonded to the RDL. Connections of the RDL are aligned to semiconductor die connections or interconnect bridge connections. In some embodiments, solder bumps (not shown) may be used. Accordingly, connections of the other one of the interconnect bridge or semiconductor dies are bonded to connections on the upper RDL surface.

At 304, substrate 391 of the interconnect bridge is removed to expose an interconnect layer 390. A surface 395 comprises the interconnect bridge. Accordingly, at 305 solder bumps may be formed to electrically couple connections on surface 395 to a circuit board, for example.

Figure 4A:
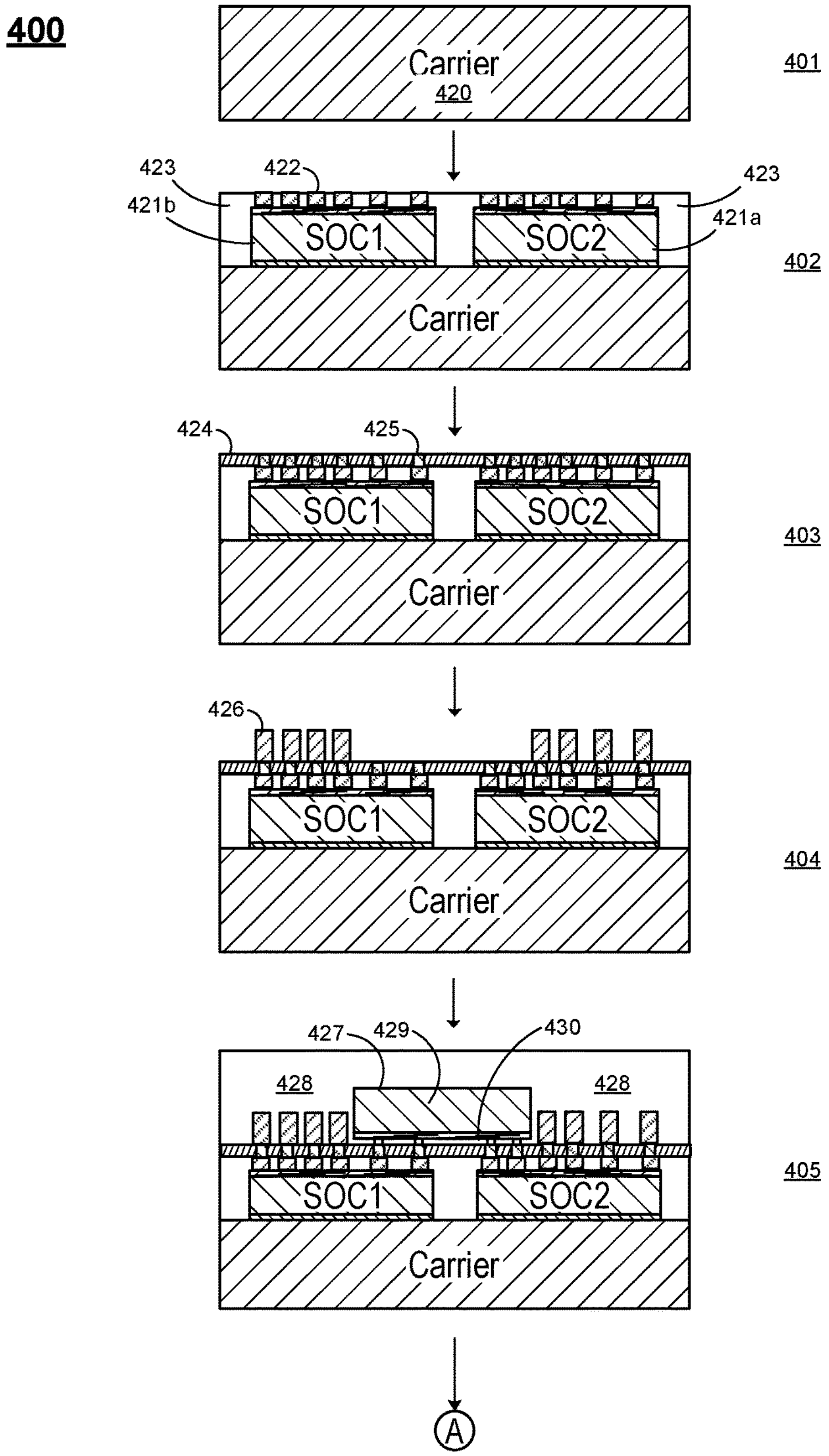
FIG. 4A-B illustrate one example semiconductor packaging process and package according to an embodiment.
Figure 4B:
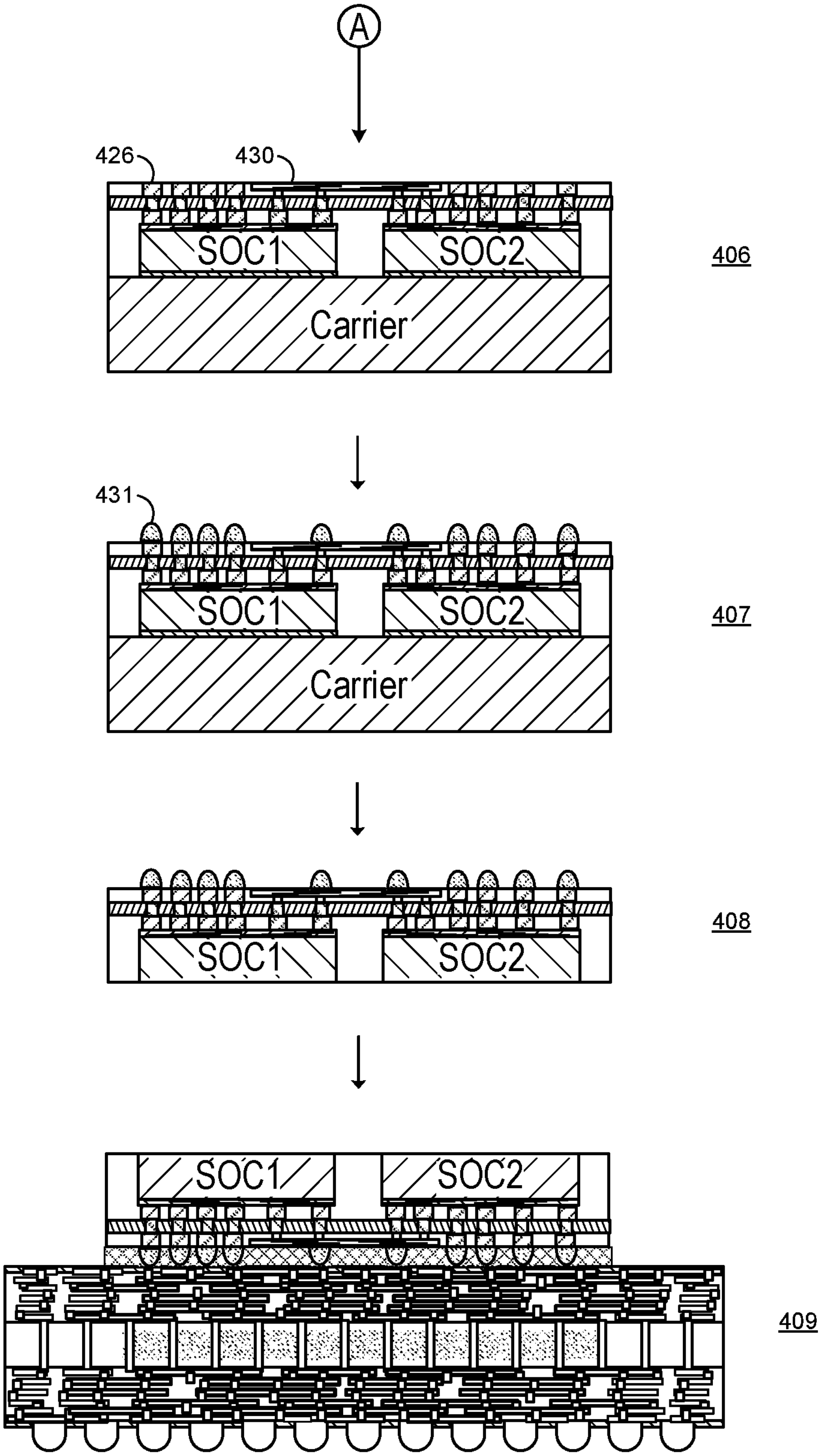

FIG. 4A-B illustrate one example semiconductor packaging process and package according to an embodiment. Process 400 may start with a carrier 420 at step 401, such as a silicon or glass (e.g., Pyrex® glass by Corning, Inc.) substrate. At 402, two semiconductor dies (e.g., systems on a chip, "SOCs") 421*a-b* are attached to the carrier, for example with a die attach film. The SOCs include connections (e.g., contacts) as illustrated at 422. A mold compound 423 is formed around the SOCs and grinded to expose the connections 422. At 403 a redistribution layer 424 is formed over the SOCs. In this example, redistribution layer (RDL) 424 includes lower connections contacting the connections of the SOC and upper connections electrically coupled to the lower connections. The lower and upper connections of the RDL may be in different locations of the lower and upper RDL surfaces to move the contact points from the SOC contact points on the lower RDL surface to other locations on the upper RDL surface, for example. At 404, conductive pillars (e.g., a copper, Cu, pillar 426) are formed on a portion of the upper RDL surface connections. As illustrated further below, pillars are not formed on the upper RDL surface connections in locations where a silicon bridge die is to be connected (e.g., in regions of overlap between the bridge die and SOCs). At 405, a silicon bridge die 427 is flip chip attached to the upper RDL surface. Flip chip attaching refers to attaching a structure upside down, as illustrated at 405. The bridge die 427 may comprise a substrate 429 (e.g., 50-110 μm of Si or glass) and an interconnect layer 430 (e.g., an interconnect layer may comprise multiple metalization layers that are 2 μm/layer). The interconnect layer of the bridge may comprise first conductors configured to electrically couple connections of SOC 421*a* and connections SOC 421*b* through RDL 424 and second conductors configured to electrically couple connections of the interconnect bridge on opposite surfaces of the interconnect layer to contact the SOCs in a region where the interconnect bridge overlaps the first and second semiconductor dies.

The process proceeds from A in FIG. 4A to A in FIG. 4B. At 406, the structure is backgrinded to remove the silicon bridge die substrate and mold compound. In this example, grinding exposes connections on the upper surface of interconnect layer 430 of the bridge die. The connections on the upper surface of layer 430 are electrically coupled to connections on the lower surface of layer 430, which in turn are coupled through the RDL layer to SOC connections in an overlap region. The upper surface connections are in the same plane as (on the same surface as) connections to the exposed and grinded pillars 426. At 407, solder bumps (e.g., solder bump 431) may be formed on the pillar connections and upper surface connections of the interconnect layer 430. Solder bumps may be C4 solder bumps as are known to those skilled in the art, for example. At 408, the carrier 420 is removed and individual integrated circuits (ICs) may be singulated (cut into individual ICs comprising SOCs coupled together through the interconnect layer of the bridge die), for example. At 409, an IC may be attached to a circuit board, such as a printed circuit board (PCB) or a flexible circuit board (FCB), for example.

Figure 5A:
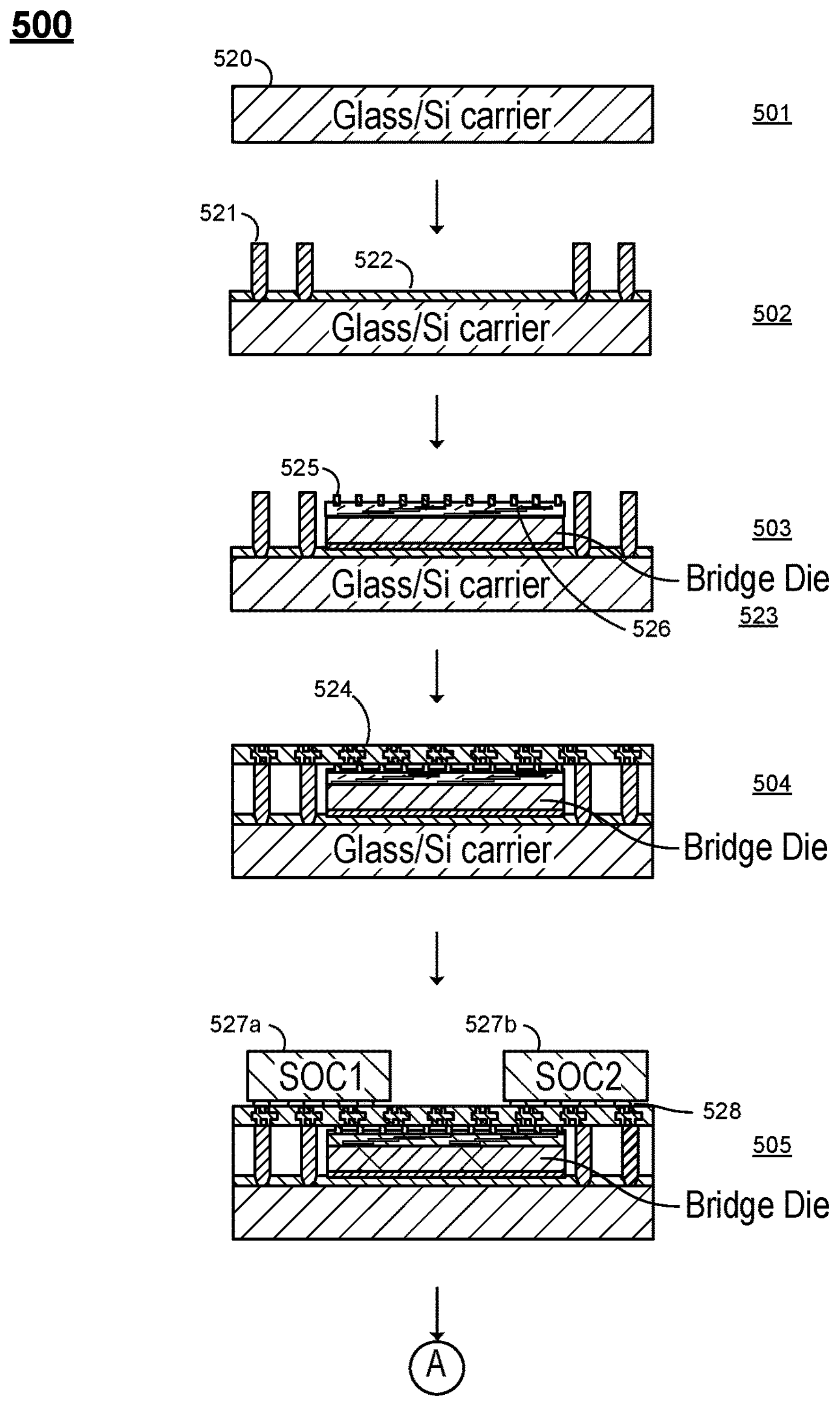
FIG. 5A-B illustrates another example semiconductor packaging process and package according to an embodiment.
Figure 5B:
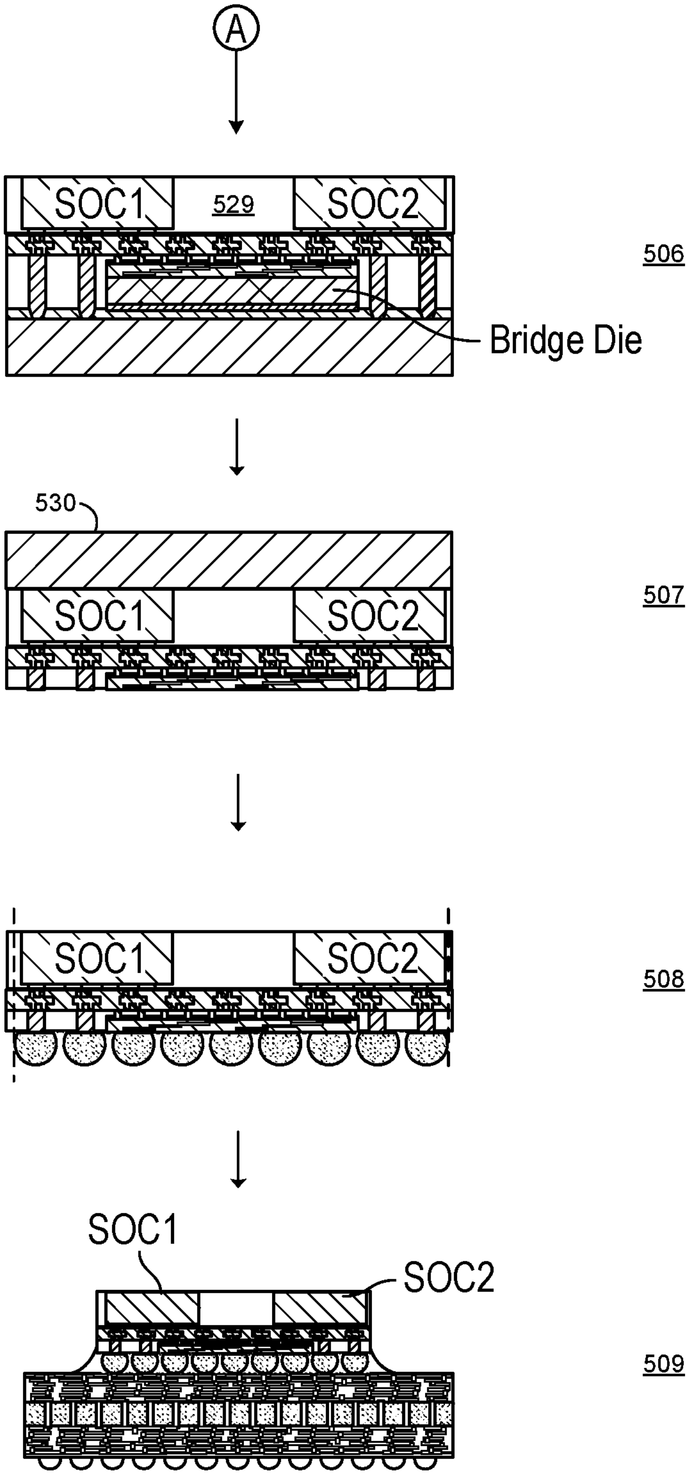

FIG. 5A-B illustrates another example semiconductor packaging process and package according to an embodiment. Process 500 may start with a carrier 520 at step 501. At 502, conductive pillars 521 (e.g., copper) are formed. A polyimide layer 522 may be formed on the surface of carrier 501 and etched in areas where pillars 521 may be formed, for example. At 503, bridge die 523 is attached to the surface of the carrier (and/or polyimide layer). At 504, molding compound is formed and grinded to expose connections to the pillars and upper surface connections 525 to the bridge die. Redistribution layer (RDL) 524 is formed such that connections on the lower surface of the RDL are in contact with upper surface connections of the pillars and connections 525 of an interconnect layer 526. Connections 525 may comprise contacts to the interconnect layer for connecting the RDL, for example. At 505, solder bumps (e.g., C4 solder bumps 528) are formed on the upper surface connections of RDL 524 and two semiconductor dies (SOCs) 527*a* and 527*b* are attached.

The process proceeds from A in FIG. 5A to A in FIG. 5B. At 506, molding compound 259 is formed around the SOCs and planed (e.g., backgrinded) to form a surface. The SOCs may or may not be exposed in various embodiments. At 507, the carrier 520 is removed. The carrier 520 may be removed by mechanical grind and finished with an etch or chemical mechanical polish (CMP), for example. Accordingly, the substrate of the bridge die is removed exposing the lower surface of the interconnect layer as illustrated at 507. The pillars are exposed in the same surface as lower surface connections of the interconnect layer, for example. Additionally, at 507, a new carrier 530 is formed above the SOCs. At 508, solder bumps are formed on the connections to the pillars coupled to connections of the SOCs through the pillars and RDL in regions of non-overlap with the bridge die interconnect layer. Additionally, solder bumps are formed on the lower surface connections to the interconnect layer and coupled to connections of the SOCs through the RDL in regions of overlap with the bridge die interconnect layer. As mentioned above, in some embodiments, power connections may be couple through the lower surface connections of the bridge die interconnect layer and to power input connections of the SOCs in regions of overlap between the bridge die and SOCs, for example. Further, the individual multichip ICs may be singulated into individual IC structures. At 509, the multichip ICs may be bonded to a circuit board.

FURTHER EXAMPLES

Each of the following non-limiting features in the following examples may stand on its own or may be combined in various permutations or combinations with one or more of the other features in the examples below.

In one embodiment, the present disclosure includes a semiconductor package comprising: a first semiconductor die comprising a plurality of connections; a second semiconductor die comprising a plurality of connections; a redistribution layer comprising upper connections coupled to the first and second semiconductor dies and lower connections, wherein one or more particular upper connections are electrically coupled to one or more particular lower connections; and an interconnect bridge overlapping a portion of the first and second semiconductor dies, the interconnect bridge comprising upper connections coupled to the lower connections of the redistribution layer and lower connections, the interconnect bridge comprising: a first plurality of conductors configured to electrically couple the plurality of connections of a first semiconductor die and the plurality of connections of the second semiconductor die through the redistribution layer; and a second plurality of conductors configured to electrically couple one or more particular lower connections of the interconnect bridge to one or more upper connections of the interconnect bridge and to one or more connections of the first and second semiconductor dies in a region where the interconnect bridge overlaps the first and second semiconductor dies.

In one embodiment, the interconnect bridge is substrateless.

In one embodiment, the interconnect bridge is a metalization layer of a silicon bridge die.

In one embodiment, the redistribution layer is an organic redistribution layer comprising polyimide.

In one embodiment, the redistribution layer is a fabricated redistribution layer comprising silicon dioxide.

In one embodiment, the redistribution layer comprises copper conductors.

In one embodiment, the first plurality of conductors are interface signal conductors and the second plurality of conductors are power conductors.

In one embodiment, the second plurality of conductors run substantially vertically from a first solder bump on one or more lower connections of the interconnect bridge to one or more lower connections of the redistribution layer.

In one embodiment, the plurality of connections of the first and second semiconductor dies are coupled to solder bumps, and the upper connections of the redistribution layer are coupled to the first and second semiconductor dies connections through the solder bumps.

In one embodiment, the package further comprises a third plurality of conductors configured vertically and electrically coupled to one or more connections of the first and second semiconductor dies in regions where the interconnect bridge does not overlap the first or second semiconductor dies.

In one embodiment, the lower connections of the interconnect bridge are in a same plane as connections to the third plurality of conductors.

In one embodiment, the upper and lower connections of the redistribution layer are in different positions.

In one embodiment, the package further comprises a circuit board comprising a plurality of connections electrically coupled to the lower connections of the interconnect bridge and the connections to the third plurality of conductors coupled to the connections of the first and second semiconductor dies in regions where the interconnect bridge does not overlap the first or second semiconductor dies.

In one embodiment, the circuit board connections are electrically coupled to the lower connections of the interconnect bridge and the connections to the third plurality of conductors through solder bumps.

In another embodiment, the present disclosure includes a semiconductor package comprising: a first semiconductor die comprising a plurality of connections; a second semiconductor die comprising a plurality of connections; a redistribution layer comprising upper connections coupled to the first and second semiconductor dies through first solder bumps and lower connections, wherein one or more particular upper connections are electrically coupled to one or more particular lower connections; an interconnect bridge overlapping a portion of the first and second semiconductor dies, the interconnect bridge comprising upper connections coupled to the lower connections of the redistribution layer and lower connections, the interconnect bridge comprising: a first plurality of conductors configured to electrically couple the plurality of connections of a first semiconductor die and the plurality of connections of the second semiconductor die through the solder bumps and the redistribution layer; and a second plurality of conductors configured to electrically couple one or more particular lower connections of the interconnect bridge to one or more upper connections of the interconnect bridge and through the first solder bumps to one or more connections of the first and second semiconductor dies in a region where the interconnect bridge overlaps the first and second semiconductor dies; copper pillars formed outside the region where the interconnect bridge overlaps the first and second semiconductor dies; and a plurality of second solder bumps connected to the copper pillars and the lower connections of the interconnect bridge.

In another embodiment, the present disclosure includes a semiconductor package comprising: a first semiconductor die comprising a plurality of connections; a second semiconductor die comprising a plurality of connections; a redistribution layer comprising upper connections in contact with connections to the first and second semiconductor dies and lower connections, wherein one or more particular upper connections are electrically coupled to one or more particular lower connections; and an interconnect bridge overlapping a portion of the first and second semiconductor dies, the interconnect bridge comprising upper connections coupled to the lower connections of the redistribution layer through first solder bumps and lower connections, the interconnect bridge comprising: a first plurality of conductors configured to electrically couple the plurality of connections of a first semiconductor die and the plurality of connections of the second semiconductor die through the redistribution layer; and a second plurality of conductors configured to electrically couple one or more particular lower connections of the interconnect bridge to one or more upper connections of the interconnect bridge and to one or more connections of the first and second semiconductor dies in a region where the interconnect bridge overlaps the first and second semiconductor dies; copper pillars formed outside the region where the interconnect bridge overlaps the first and second semiconductor dies; and a plurality of second solder bumps connected to the copper pillars and the lower connections of the interconnect bridge.

In one embodiment, the first solder bumps are C4 solder bumps.

In one embodiment, the package further comprises a circuit board coupled to the plurality of second solder bumps.

In another embodiment, the present disclosure includes a semiconductor packaging process comprising: forming a redistribution layer on a first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to a plurality of connections on one of an interconnect bridge or a plurality of semiconductor dies; bonding a plurality of connections of the other one of the interconnect bridge or the plurality of semiconductor dies to at least a portion of the plurality of connections on the second redistribution layer surface; removing a substrate of the interconnect bridge to expose an interconnect layer, the interconnect layer comprising: a first plurality of conductors configured to electrically couple, through the redistribution layer, a plurality of connections of a first semiconductor die of the plurality of semiconductor dies and a plurality of connections of a second semiconductor die of the plurality of semiconductor dies; and a second plurality of conductors configured to electrically couple one or more particular connections on a first surface of the interconnect layer to one or more connections on a second exposed surface of the interconnect layer, and to one or more connections of the first and second semiconductor dies in a region where the interconnect bridge overlaps the first and second semiconductor dies.

In one embodiment, the first surface comprises the interconnect bridge, and wherein said bonding comprises forming solder bumps between the plurality of connections on the first redistribution layer surface and the plurality of connections on the plurality of semiconductor dies.

In one embodiment, the first surface comprises the plurality of semiconductor dies, and wherein said bonding comprises bonding the plurality of connections on the first redistribution layer surface and the plurality of connections on the plurality of semiconductor dies.

In one embodiment, the process further comprising forming solder bumps on the second surface comprising the exposed interconnect layer.

In one embodiment, the process further comprising bonding a plurality of circuit board connections on a first surface of a circuit board to the solder bumps on the second surface comprising the exposed interconnect layer to electrically couple the one or more connections on the second surface comprising the exposed interconnect layer to the plurality of connections of the circuit board.

In one embodiment, the second surface comprising the exposed interconnect layer further comprises a plurality of connections to a third plurality of conductors electrically coupled to connections of the first and second semiconductor dies in regions where the interconnect bridge does not overlap the first or second semiconductor dies, and wherein said bonding the plurality of circuit board connections on the first surface of the circuit board to the solder bumps on the second surface comprising the exposed interconnect layer further comprises bonding a second plurality of circuit board connections to the third plurality of conductors.

In one embodiment, the interconnect layer is a metalization layer of a silicon bridge die.

In one embodiment, the redistribution layer is an organic redistribution layer comprising polyimide.

In one embodiment, the redistribution layer is a fabricated redistribution layer comprising silicon dioxide.

In one embodiment, the redistribution layer comprises copper conductors.

In one embodiment, the first plurality of conductors are interface signal conductors and the second plurality of conductors are power conductors.

In one embodiment, the second plurality of conductors are power conductors running vertically, at least in part, between the second surface of the interconnect bridge comprising the exposed interconnect layer and one or more of the portion of the plurality of connections on the second redistribution layer surface.

In one embodiment, the plurality of connections on the first redistribution layer surface are in different positions along a horizontal axis than the plurality of connections on the second redistribution layer surface.

In another embodiment, the present disclosure includes a semiconductor packaging process comprising: attaching a first semiconductor die and a second semiconductor die to a first carrier; forming a molding compound around the first and second semiconductor dies; grinding the molding compound to form a first surface comprising a plurality of exposed connections to the first and second semiconductor dies; forming a redistribution layer on the first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to the exposed connections of the first and second semiconductor dies; bonding a plurality of connections of an interconnect bridge to at least a portion of the plurality of connections on the second redistribution layer surface; forming a plurality of copper pillars on connections of the second redistribution layer surface outside a region of overlap between the interconnect bridge and the first and second semiconductor dies; forming a molding compound over the interconnect bridge and copper pillars; removing a substrate of the interconnect bridge to expose connections to the interconnect layer and expose connections to the copper pillars, the interconnect layer comprising: a first plurality of conductors configured to electrically couple, through the redistribution layer, a plurality of connections of the first semiconductor die and a plurality of connections of the second semiconductor die; and a second plurality of conductors configured to electrically couple one or more particular connections on a first surface of the interconnect layer to one or more exposed connections on a second surface of the interconnect layer, and to one or more connections of the first and second semiconductor dies in a region where the interconnect bridge overlaps the first and second semiconductor dies; forming solder bumps on exposed connections of the interconnect layer and exposed connections of the pillars; and removing the carrier.

In one embodiment, the process further comprising attaching the solder bumps to a circuit board.

In one embodiment, prior to said removing the substrate of the interconnect bridge, the plurality of copper pillars extend vertically above an interconnect layer of the interconnect bridge.

In another embodiment, the present disclosure includes a semiconductor packaging process comprising: forming a plurality of copper pillars a surface of a carrier over a first region; attaching an interconnect bridge to the carrier; forming a molding compound around the interconnect bridge and pillars; grinding the molding compound to form a first surface comprising a plurality of exposed connections to the interconnect bridge and pillars; forming a redistribution layer on the first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to the exposed connections of the interconnect bridge and pillars; attaching a plurality of connections of first and second semiconductor dies to at least a portion of the plurality of connections on the second redistribution layer surface; forming a molding compound over the first and second semiconductor dies; removing a substrate of the interconnect bridge to expose connections to an interconnect layer and expose connections to the copper pillars, the interconnect layer comprising: a first plurality of conductors configured to electrically couple, through the redistribution layer, a plurality of connections of the first semiconductor die and a plurality of connections of the second semiconductor die; and a second plurality of conductors configured to electrically couple one or more particular connections on a first surface of the interconnect layer to one or more exposed connections on a second surface of the interconnect layer, and to one or more connections of the first and second semiconductor dies in a region where the interconnect bridge overlaps the first and second semiconductor dies; forming solder bumps on exposed connections of the interconnect layer and exposed connections of the pillars; and removing the carrier.

In one embodiment, the process further comprising attaching the solder bumps to a circuit board.

In one embodiment, prior to said grinding, the plurality of copper pillars extend vertically above an interconnect layer of the interconnect bridge.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A semiconductor packaging process comprising:

forming a redistribution layer on a first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to a plurality of connections on one of an interconnect bridge or a plurality of semiconductor dies, the interconnect bridge comprising a substrate;

bonding a plurality of connections of the other one of the interconnect bridge or the plurality of semiconductor dies to at least a portion of the plurality of connections on the second redistribution layer surface;

removing the substrate of the interconnect bridge to expose an interconnect layer on a surface opposite the redistribution layer, the interconnect layer comprising:

a first plurality of conductors configured to electrically couple, through the redistribution layer, a plurality of connections of a first semiconductor die of the plurality of semiconductor dies and a plurality of connections of a second semiconductor die of the plurality of semiconductor dies; and a second plurality of conductors configured to electrically couple one or more particular connections on a first interconnect layer surface of the interconnect layer to one or more connections on a second exposed interconnect layer surface of the interconnect layer, and to one or more connections of the first and second semiconductor dies in a region where the interconnect bridge overlaps the first and second semiconductor dies.

2. The process of claim 1, wherein the first surface comprises the interconnect bridge, and wherein said bonding comprises forming solder bumps between the plurality of connections on the first redistribution layer surface and the plurality of connections on the plurality of semiconductor dies.

3. The process of claim 1, wherein the first surface comprises the plurality of semiconductor dies, and wherein said bonding comprises bonding the plurality of connections on the first redistribution layer surface and the plurality of connections on the plurality of semiconductor dies.

4. The process of claim 1, further comprising forming solder bumps on the second exposed interconnect layer surface of the interconnect layer.

5. The process of claim 4, further comprising bonding a plurality of connections of a circuit board on a first surface of the circuit board to the solder bumps on the second exposed interconnect layer surface of the interconnect layer to electrically couple the one or more connections on the second exposed interconnect layer surface of the interconnect layer to the plurality of connections of the circuit board.

6. The process of claim 5, wherein the second exposed interconnect layer surface of the interconnect layer further comprises a plurality of connections to a third plurality of conductors electrically coupled to connections of the first and second semiconductor dies in regions where the interconnect bridge does not overlap the first or second semiconductor dies, and wherein said bonding the plurality of circuit board connections on the first surface of the circuit board to the solder bumps on the second exposed interconnect layer surface of the interconnect layer further comprises bonding a second plurality of circuit board connections to the third plurality of conductors.

7. The process of claim 1, wherein the interconnect layer is a metalization layer of a silicon bridge die.

8. The process of claim 1, wherein the redistribution layer is an organic redistribution layer comprising polyimide.

9. The process of claim 1, wherein the redistribution layer is a fabricated redistribution layer comprising silicon dioxide.

10. The process of claim 1, wherein the redistribution layer comprises copper conductors.

11. The process of claim 1, wherein the first plurality of conductors are interface signal conductors and the second plurality of conductors are power conductors.

12. The process of claim 1, wherein the second plurality of conductors are power conductors running vertically, at least in part, between the second exposed interconnect layer surface of the interconnect layer and the portion of the plurality of connections on the second redistribution layer surface.

13. The process of claim 1, wherein the plurality of connections on the first redistribution layer surface are in different positions along a horizontal axis than the plurality of connections on the second redistribution layer surface.

14. A semiconductor packaging process comprising:

attaching a first semiconductor die and a second semiconductor die to a carrier;

forming a molding compound around the first and second semiconductor dies;

grinding the molding compound to form a first surface comprising a plurality of exposed connections to the first and second semiconductor dies;

forming a redistribution layer on the first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to the exposed connections of the first and second semiconductor dies;

bonding a plurality of connections of an interconnect bridge to at least a portion of the plurality of connections on the second redistribution layer surface, the interconnect bridge comprising a substrate;

forming a plurality of copper pillars on connections of the second redistribution layer surface outside a region of overlap between the interconnect bridge and the first and second semiconductor dies;

forming a molding compound over the interconnect bridge and the plurality of copper pillars;

removing the substrate of the interconnect bridge to expose connections to an interconnect layer of the interconnect bridge on a surface opposite the redistribution layer and expose connections to the plurality of copper pillars, the interconnect layer comprising:

a first plurality of conductors configured to electrically couple, through the redistribution layer, a plurality of connections of the first semiconductor die and a plurality of connections of the second semiconductor die; and a second plurality of conductors configured to electrically couple one or more particular connections on a first interconnect layer surface of the interconnect layer to one or more exposed connections on a second interconnect layer surface of the interconnect layer, and to one or more connections of the first and second semiconductor dies in a region where the interconnect bridge overlaps the first and second semiconductor dies;

forming solder bumps on exposed connections of the interconnect layer and exposed connections of the plurality of copper pillars; and removing the carrier.

15. The process of claim 14, further comprising attaching the solder bumps to a circuit board.

16. The process of claim 14, wherein, prior to said removing the substrate of the interconnect bridge, the plurality of copper pillars extend vertically above the interconnect layer of the interconnect bridge.

17. A semiconductor packaging process comprising:

forming a plurality of copper pillars on a surface of a carrier over a region;

attaching an interconnect bridge to the carrier the interconnect bridge comprising a substrate;

forming a molding compound around the interconnect bridge and the plurality of copper pillars;

grinding the molding compound to form a first surface comprising a plurality of exposed connections to the interconnect bridge and the plurality of copper pillars;

forming a redistribution layer on the first surface, the redistribution layer comprising a first redistribution layer surface comprising a plurality of connections and a second redistribution layer surface comprising a plurality of connections, wherein one or more particular connections on the first redistribution layer surface are electrically coupled to one or more particular connections on the second redistribution layer surface, and wherein at least a portion of the plurality of connections on the first redistribution layer surface are electrically coupled to the exposed connections of the interconnect bridge and the plurality of copper pillars;

attaching a plurality of connections of first and second semiconductor dies to at least a portion of the plurality of connections on the second redistribution layer surface;

forming a molding compound over the first and second semiconductor dies;

removing the substrate of the interconnect bridge to expose connections to an interconnect layer on a surface opposite the redistribution layer and expose connections to the copper pillars, the interconnect layer comprising:

a first plurality of conductors configured to electrically couple, through the redistribution layer, a plurality of connections of the first semiconductor die and a plurality of connections of the second semiconductor die; and a second plurality of conductors configured to electrically couple one or more particular connections on a first interconnect layer surface of the interconnect layer to one or more exposed connections on a second interconnect layer surface of the interconnect layer, and to one or more connections of the first and second semiconductor dies in a region where the interconnect bridge overlaps the first and second semiconductor dies;

forming solder bumps on exposed connections of the interconnect layer and exposed connections of the plurality of copper pillars; and removing the carrier.

18. The process of claim 17, further comprising attaching the solder bumps to a circuit board.

19. The process of claim 17, wherein, prior to said grinding, the plurality of copper pillars extend vertically above the interconnect layer of the interconnect bridge.

* * * * *